United States Patent [19]

Khieu

[11] Patent Number: 5,724,294
[45] Date of Patent: Mar. 3, 1998

[54] SELF-TRACKING SENSE AMPLIFIER STROBING CIRCUIT AND METHOD

[75] Inventor: Cong Q. Khieu, San Jose, Calif.

[73] Assignee: Intel Corporation, Santa Clara, Calif.

[21] Appl. No.: 777,546

[22] Filed: Dec. 30, 1996

[51] Int. Cl.[6] .................................................. G11C 7/00
[52] U.S. Cl. .......................... 365/210; 365/190; 365/203; 365/207
[58] Field of Search ............................... 365/210, 207, 365/203, 190

[56] References Cited

U.S. PATENT DOCUMENTS

| | | | |
|---|---|---|---|
| 5,029,135 | 7/1991 | Okubo | 365/210 X |
| 5,243,573 | 9/1993 | Makihara et al. | 365/210 X |
| 5,646,902 | 7/1997 | Park | 365/195 X |

*Primary Examiner*—Do Hyun Yoo
*Attorney, Agent, or Firm*—Cynthia Thomas Faatz

[57] ABSTRACT

A self-tracking sense amplifier strobing circuit and process to provide a sense amplifier enable signal in order to reliably control memory read operations over a wide variety of processing conditions. An array of self-tracking memory cells is configured to store a fixed value and includes at least a first tracking cell coupled to receive a wordline enable signal. First and second bitlines are coupled to the first array with the first bitline to be coupled to a power source. An output coupled to the second bitline is asserted to provide a sense amplifier enable signal when the second bitline reaches a predetermined voltage in response to the wordline enable signal being received by the tracking cell.

15 Claims, 5 Drawing Sheets

SELF-TRACKING SENSE AMPLIFIER STROBING CIRCUIT AND METHOD

BACKGROUND OF THE INVENTION

1. Field of the Invention

The invention relates to the field of memory technologies, and more particularly, to controlling the timing of the sense amplifier enable signal during a memory read operation.

2. Description of Related Art

Many memories and integrated circuit devices including embedded memories must be rejected during production testing due to the existence of race conditions between the wordline and sense amplifier enable signals which help to control memory accesses. These race conditions can cause memory accesses to be unreliable, and therefore, a memory with such race conditions must be rejected during manufacturing testing. Embedded memories in modern microprocessors and other high speed integrated circuits, have been a limiting factor in terms of achieving high yield in some cases for this reason.

For example, in memories which use a differential sensing scheme to detect the contents of the memory, during a memory read operation, first the wordline of the memory cell to be read is asserted. A differential is then developed between two bitlines coupled to the memory cell to be read. After the bitline differential has developed to a predetermined minimum differential voltage, the associated sense amplifier or "sense amp" can be enabled to read out the information from the selected memory cell. The particular minimum differential voltage required to exist between the bitlines before a sense amp is enabled to read the contents of the memory cell is determined by the sense amp characteristics.

If the sense amp enable signal is asserted too early, before the bitlines have developed the minimum required differential voltage, the correct data may not be recovered and the memory read operation may produce erroneous information. The time to develop the bitline differential can vary based on an inherent voltage offset of the sense amp as well as the current through the memory cell and the capacitance of the bitline, each of which can vary based on the process used to develop the memory.

The issue of potential race conditions between the wordline and the sense amp has been addressed in some cases by providing one or more inverter delays between the assertion of the control signal which enables the wordline and assertion of the control signal which enables the sense amp. However, this approach relies on the capacitance and current of the memory cell being within a particular range as targeted by the design such that the delay caused by the inverters does not cause memory read accesses to be inordinately long. If the capacitance and/or current have drifted out of this range for some reason, for example if the memory cell capacitance and/or memory cell current are not accurately extracted from the layout, the circuit will fail and the production yield will be low.

Thus, a new approach to providing memory read control signals is needed which prevents race conditions between the wordline and sense amplifier enable signals and which enables high production yield even in cases where the manufacturing process or power supplies varies such that the memory cell capacitance and/or memory cell current are outside of a targeted range.

SUMMARY OF THE INVENTION

A method and apparatus for self-tracking of a sense amplifier enable signal in order to reliably control memory read operations over a wide variety of processing conditions is described. In accordance with the invention, a first tracking array including at least one tracking memory cell which is the same as the memory cells forming a memory to be read and is configured on the memory to be read to store a fixed value. The tracking cell is coupled to receive a wordline enable signal. First and second bitlines are coupled to the tracking cell with the first bitline to be coupled to a power source. An output coupled to the second bitline is asserted to provide a sense amplifier enable signal when the second bitline reaches a predetermined voltage in response to the wordline enable signal being received by the tracking cell.

BRIEF DESCRIPTION OF THE DRAWINGS

The invention will be understood more fully from the detailed description given below and from the accompanying drawings of embodiments of the invention, which, however, should not be taken to limit the invention to the specific embodiments, but are for explanation and understanding only.

DETAILED DESCRIPTION

The present invention relates to a method and apparatus for self-tracking of a sense amplifier (sense amp) enable signal during a memory read operation in order to prevent race conditions across a wide variety of processing variations. In the following description, numerous specific details such as specific memory read operation control circuitry, numbers of memory cells, and logic and circuit configurations are set forth in order to provide a thorough understanding of the invention. However, it will be appreciated by those skilled in the art that the invention may be practiced without these specific details. In other instances, well-known structures, circuits, logic and steps have not been described in detail in order to avoid obscuring the invention.

The present invention provides a method and apparatus for providing a sense amp enable signal which enables reliable memory read operations over a wide range of processing variations. The self-tracking sense amplifier strobing circuit of the invention includes a first self-tracking array which includes at least one self-tracking memory cell which is configured on a memory to be read using the same process and configuration as is used to produce cells on the memory (i.e. the tracking cell is the same as the cells on the array to be read). The tracking memory cell is configured to store a logical "0" in one embodiment. The tracking memory cell is coupled to receive a wordline enable (WLE) signal indicating the beginning of a memory read cycle which is concurrently received by the memory to be read.

Bitline (BL) and bitline# (BL#) signal lines are coupled to each cell in the tracking array with the BL# line being coupled to Vcc. An output is coupled to the BL signal, also referred to as the self-tracking bitline, and is asserted to provide a sense amp enable signal when a predetermined voltage is reached on the BL signal line following assertion of the WLE signal. Because the tracking memory cells are produced using the same process and configuration as the cells of the memory to be read, the time to develop the required differential tracks with the memory array avoiding race conditions across a wide range of processing variations. The self-tracking sense amplifier strobing circuit of the invention is described in more detail below.

Figure 1:
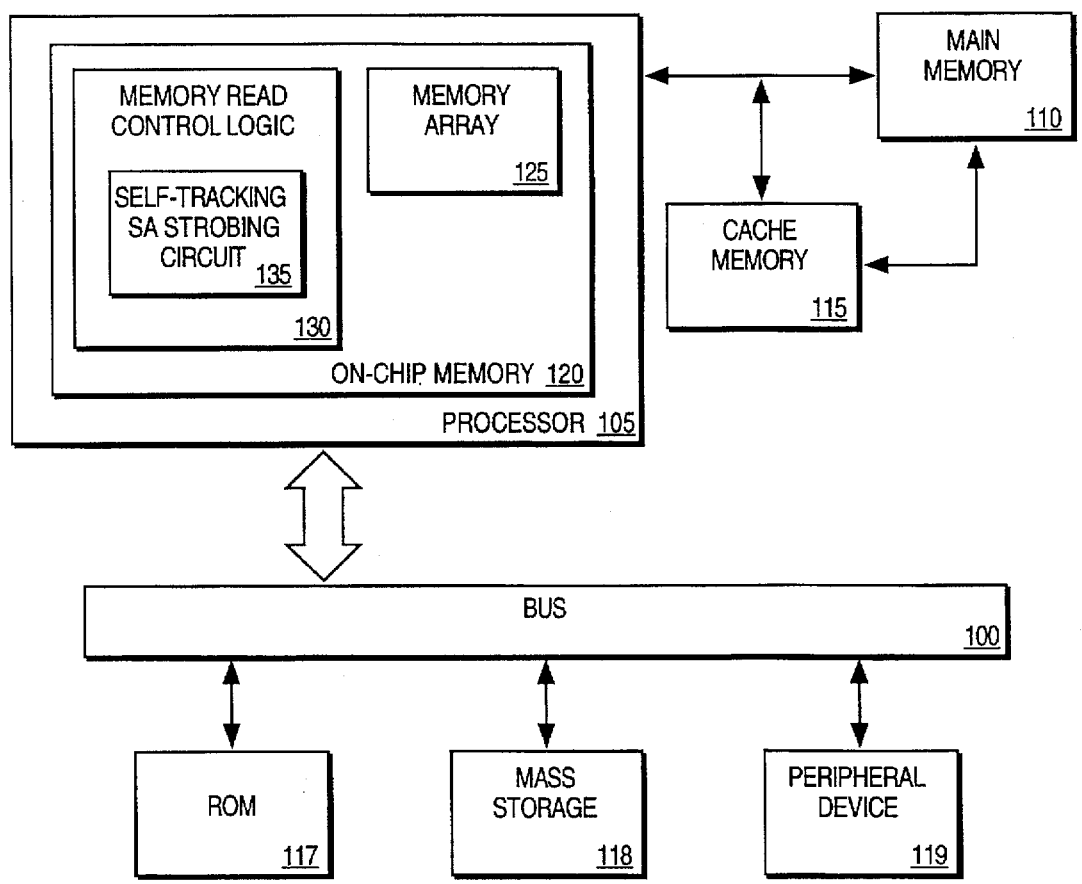
FIG. 1 is a block diagram of a computer system which may advantageously utilize memories which include the self-tracking sense amplifier strobing circuit of the invention.

FIG. 1 illustrates a simplified block diagram of a computer system including memories which may advantageously utilize the self-tracking sense amplifier strobing circuit of the invention. The computer system includes a bus 100 for communicating information, a processor 105 coupled to the bus for processing information, a main memory 110 coupled to the processor 105 for storing information and instructions for the processor 105 and an external cache memory 115 for storing frequently and/or recently used information for the processor 105.

The computer system also includes read-only memory (ROM) 117 coupled to the bus 100 for storing fixed information for the processor 105, a mass storage device 118 such as a hard disk drive for storing information for the processor 105 and peripheral devices 119 such as input devices, display devices and other computer system peripheral devices.

The processor 105 in this example includes on-chip cache memory 120, also referred to as level one (L1) cache memory. The L1 cache memory 120 is smaller and provides for very fast access time for a small amount of frequently or recently used information. The on-chip memory 120 includes a cache memory array 125, and memory read control logic 130. The memory read control logic 130 includes the self-tracking sense amplifier strobing circuit 135 of the invention in this example. As will be appreciated by those of skill in the art, although the self-tracking sense amplifier strobing circuit of the invention is described below as being configured on a memory such as the on-chip memory 120, other memories such as the cache memory 115 and the main memory 110 may also utilize and benefit from the self-tracking sense amplifier strobing circuit of the invention.

Figure 2:
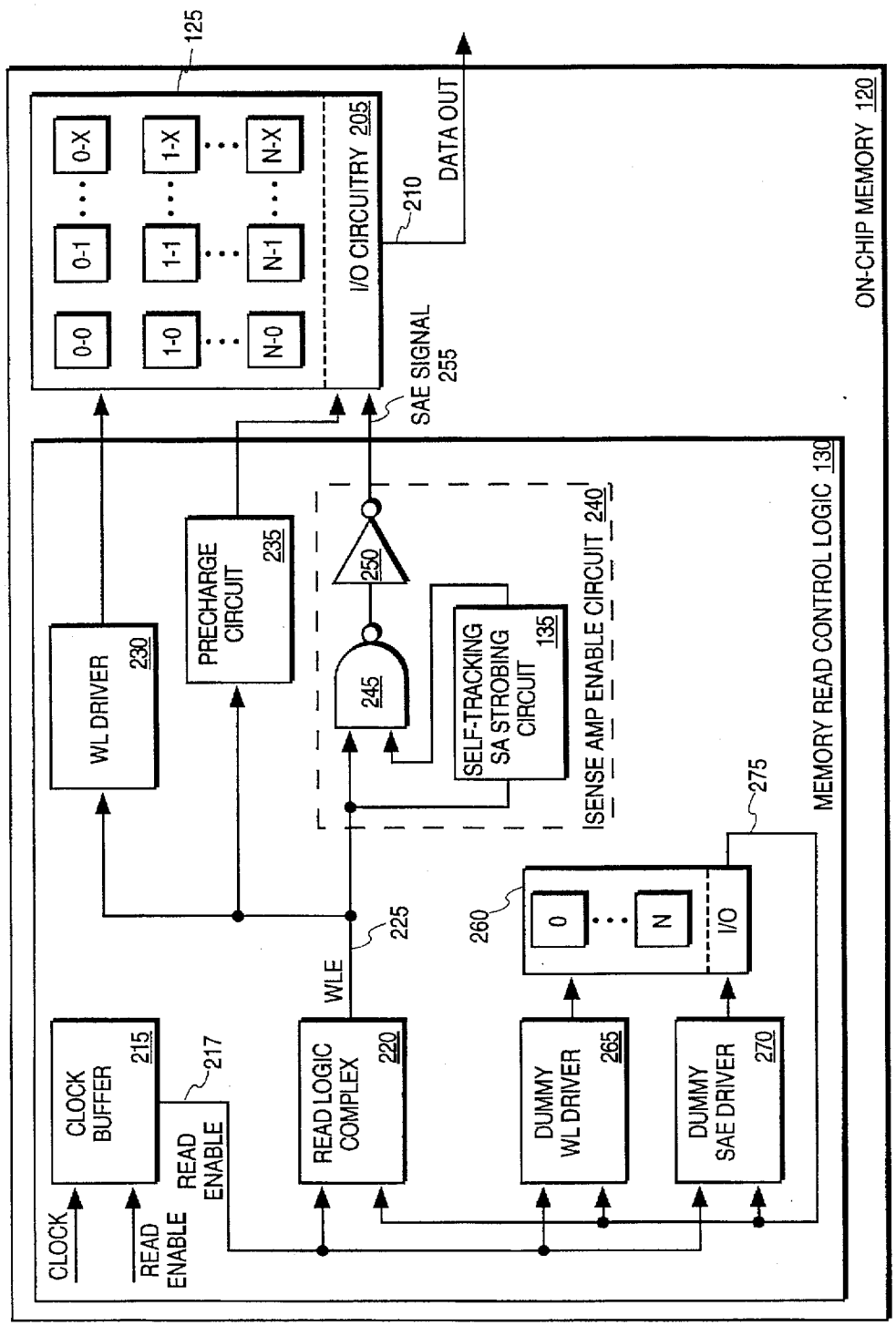
FIG. 2 illustrates a memory including memory read control circuitry utilizing the self-tracking sense amplifier strobing circuit of one embodiment of the invention.

FIG. 2 illustrates in additional detail the memory 120 including memory read control logic 130 utilizing the self-tracking sense amplifier strobing circuit of one embodiment of the invention. The memory array 125 is an X-by-N memory array including X columns and N rows of memory cells where X and N may each be a variety of numbers corresponding to any desired memory array size. The memory array 125 includes input/output (I/O) circuitry 205 which includes sense amplifiers and other circuitry required to perform memory read and write operations. Data which is read from the memory array 125 is output on the data output bus 210.

The memory read control logic 130 is coupled to the memory array 125 in order to control read operations directed to the memory array 125. It will be appreciated by those of skill in the art that the memory read control logic 130 may include other logic such as row and column decoders, for example. Further, it will be appreciated by those of skill in the art that some of the circuits and logic described in reference to the memory read control logic may be shared by memory write control logic. Such elements, along with memory write control logic, are not shown or described herein in order to avoid obscuring the present invention.

The memory read control logic 130 in accordance with one embodiment of the invention includes a clock buffer 215 which receives a clock signal and a read enable (RE) signal from sources external to the memory read control logic 130. An RE output 217 of the clock buffer is received at an input of a memory read logic complex 220 to enable a memory read operation on a clock edge. The memory read logic complex 220 includes combinatorial logic and may receive other RE inputs (not shown), other than the RE input 217 from the clock buffer 215, which control reading of the memory array 125.

The read logic complex 220 is typically combined with write logic which is not shown. The read logic complex 220 provides a wordline enable (WLE) signal 225 at its output in response to a read enable signal generated following a valid request to read data from the memory array 125. The memory read request may be received from any number of sources on the processor 105 of FIG. 1.

The output of the read logic complex 220 is coupled to an input of a WL driver 230, a precharge circuit 235, and a sense amp enable circuit 240. The WL driver 230 initiates a memory read cycle in response to the WLE signal being asserted by driving a selected wordline in the memory array 125, the selected wordline corresponding to a memory row to be read. The precharge circuit 235 precharges the bitlines prior to a memory read operation. Once the WLE signal is asserted, the precharge circuit 235 is turned off during sensing and then is turned on again once data has been successfully read.

The sense amp enable (SAE) circuit 240 includes the self-tracking sense amplifier strobing circuit 135 and combinatorial logic including a NAND gate 245 and an inverter 250 coupled to the NAND gate 245 to form a logical AND circuit. A first input of the NAND gate 245 receives the WLE signal 225 from the read logic complex 220. A second input of the NAND gate 245 receives the output of the self-tracking sense amplifier strobing circuit 135. In this manner, an SAE signal 255 is not asserted to enable reading from a memory cell of the memory array 125 unless both the WLE signal 225 and the output of the self-tracking sense amplifier strobing circuit 135 are asserted. Thus, the self-tracking sense amplifier strobing circuit 135 gates assertion of the SAE signal to prevent race conditions and provide for reliable memory read operations for a wide range of processing variations as described below.

A memory read cycle directed to the memory array 125 begins when the WLE signal is asserted and ends when a read end signal is asserted. The read end signal can be generated in any number of ways. In the example shown in FIG. 2, a dummy column of memory 260 is provided which is identical to an entire column of the memory array 125. The dummy column 260, like the columns of the memory array 125, includes N memory cells which are configured in the same manner as a column of the memory array 125 and which include the same I/O circuitry.

A dummy WL driver 265 which is similar to the WL driver 230 and a dummy SAE driver 270 each receive the RE signal 217 from the clock buffer 215 and have outputs coupled to the dummy column 260. The dummy WL driver 265 asserts a dummy WL signal in response to receiving the RE signal 217 such that a memory read operation of the dummy column 260 is initiated. Concurrently, the dummy SAE driver 270 asserts a dummy SAE signal in response to receiving the RE signal 217.

Once data is output from the dummy column 260 I/O circuitry in response to the dummy WL and dummy SAE signals, a read end signal 275 is asserted and received at an input of the read logic complex 220. In response to receiving the read end signal, the WLE signal 225 is deasserted to end the memory read cycle. The read end signal 275 is also communicated to the inputs of the dummy WL driver and the dummy SAE driver to end the dummy memory read cycle. A read end signal generated in another manner may also be used to end a memory read cycle which is controlled by the self-tracking sense amplifier strobing circuit of the invention.

Figure 3A:
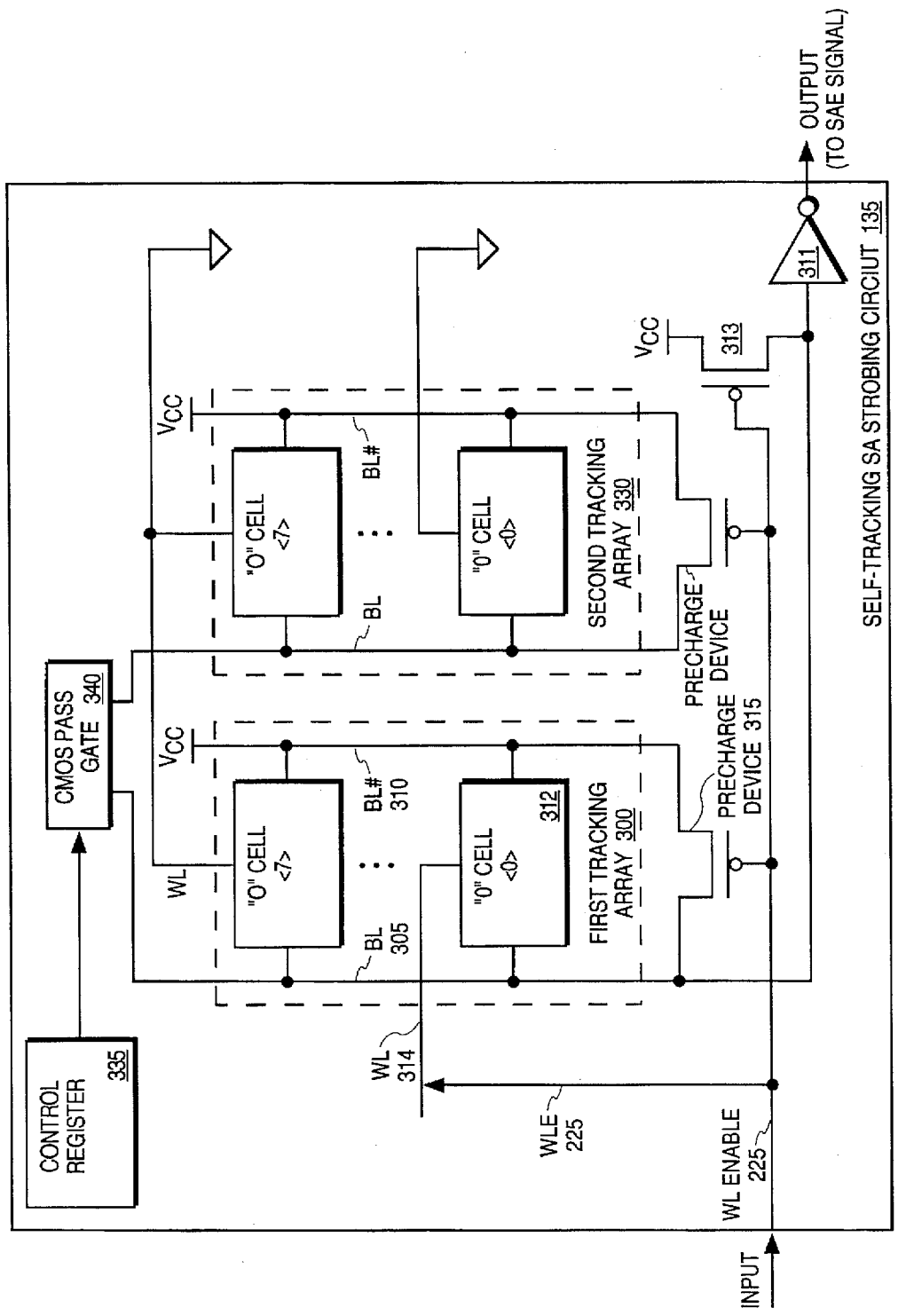
FIG. 3A illustrates the self-tracking sense amplifier strobing circuit of one embodiment of the invention.

The self-tracking sense amplifier (SA) strobing circuit of the invention is illustrated and described in more detail in reference to FIG. 3A. The self-tracking sense amplifier strobing circuit 135 includes a first array of self-tracking, or simply tracking, memory cells 300. In one embodiment, there are 8 memory cells (cells 0 ... 7) in the first array 300 although a different number of tracking memory cells may be used in other embodiments. The number of self-tracking memory cells in the first tracking array is selected to be small enough to provide enough driving capability to produce a detectable output signal and to minimize the space taken up by the self-tracking sense amplifier strobing circuit while also ensuring that the current, power and other characteristics of the memory array 125 are tracked closely enough to provide an adequate delay for the SAE signal to prevent race conditions between the SAE signal and the WLE signal.

Figure 3B:
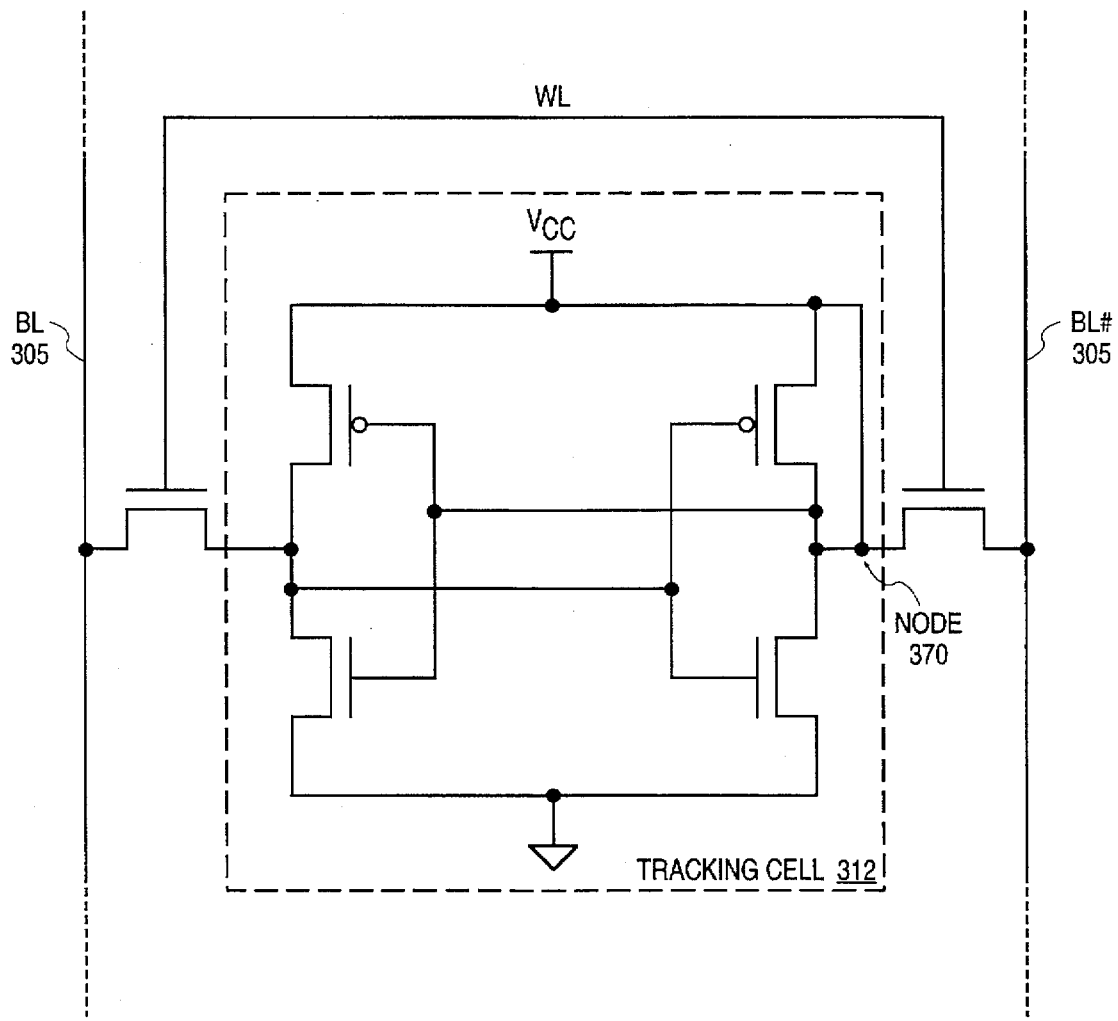
FIG. 3B illustrates an example of a memory cell configured to store a fixed value which may be advantageously used as a tracking cell in accordance with one embodiment.

Each of the tracking memory cells in the first array 300 is configured to store a fixed value, a logical "0" in one embodiment, by tying one internal node of the memory cell to Vcc. An example of such a memory cell 312 is shown in FIG. 3B. The node 370 is tied to Vcc such that the memory cell stores a logical "0". It will be appreciated by those of skill in the art that other memory cell configurations which store a fixed value are also within the scope of the invention.

Referring again to FIG. 3A, each of the tracking cells in the first tracking array 300 is coupled to a pair of bitlines including a first bitline (BL) 305, also referred to as the self-tracking bitline, and a second bitline (BL#) 310. The BL# 310 is tied to a Vcc power source such that the BL# 310 is held high. One end of the self-tracking bitline 305 is coupled to an inverter 311 which is coupled to the output of the self-tracking SA strobing circuit 135. At least one of the tracking cells in the tracking memory array, the cell 312 in FIG. 3A, has a wordline (WL) 314 coupled to receive the WLE signal 225. The self-tracking memory array 300 is also coupled to a precharge device 315 which mimics the precharge and equalization functions of precharge circuitry in the memory array 125. Another device 313 is included to precharge the cells when the WLE signal transitions to a low value. Thus, the self-tracking sense amplifier strobing circuit of the invention is a relatively simple and small circuit taking up little space.

The operation of the self-tracking sense amplifier strobing circuit is described in reference to FIGS. 2 and 3A. Referring first to FIG. 2, a read enable signal is received at the clock buffer 215, which generates an RE signal 217 on a transitioning clock edge. The RE signal 217 is received at the read logic complex 220 as well as at the dummy WL driver 265 and dummy SAE driver 270. The read logic complex 220 generates a WLE signal 225 which is received at the inputs of the WL driver 230, the precharge circuit 235 and the sense amp enable circuit 240 including the self-tracking sense amplifier strobing circuit 135.

In response to the WLE signal, the WL driver 230 asserts a selected wordline of the memory array 125 and the precharge circuit 235 is turned off. Concurrently, the WLE signal is received at a first input of the NAND gate 245 and at the input of the self-tracking sense amplifier strobing circuit 135.

Referring now to FIG. 3A, the WLE signal at the self-tracking sense amplifier strobing circuit 135 input activates the wordline 314 of the first self-tracking array 300 and also turns off the precharge device 315 to mimic the precharge and equalization process of the main memory array 125. With the precharge device 315 on (i.e. when the WLE signal is not asserted) the BL 305 is held to Vcc as it is coupled through the precharge device 315 to BL# 310 which is tied to Vcc. Once the precharge device 315 is turned off and the WL 314 is activated, the cell 312 begins to discharge current pulling the voltage of the self-tracking bitline 305 down from Vcc. Once the voltage on the BL 305 reaches a predetermined level equivalent to a logical "0" as determined by the characteristics of the inverter gates, the inverter 311 outputs a logical "1". In this manner, the output of the self-tracking sense amplifier strobing circuit is enabled such that the SAE signal 255 (FIG. 3A) is asserted and the requested memory read operation is performed.

The memory read operation ends when a read end signal is asserted in the manner described above in reference to FIG. 2. Once the read cycle is completed, the WLE signal 225 is deasserted, the precharge device 315 is turned on, and the self-tracking bitline BL 305 is reset to Vcc.

Because the self-tracking memory cell 312 is formed with the same process using the same configuration as the memory cells in the memory array 125, if the memory cells in the memory array 125 discharge slowly, so will the self-tracking memory cell 312. In this manner, if the bitline differential in the memory array 125 is slow to develop, then the predetermined voltage level required on the self-tracking bitline 305 will also be slow to develop such that the sense amp enable signal 255 is asserted after a longer delay.

Referring again to FIG. 3A, in an alternate embodiment, additional tracking arrays, such as the second tracking array 330 may be selectively enabled to change the driving capability and/or add more bitline capacitance to the self-tracking sense amplifier strobing circuit. The second tracking array 330 is selectively enabled by programming a control register 335 to control a CMOS pass gate 340 or other circuit which performs a similar selective enabling function. The configuration of a CMOS pass gate is well-known to those of skill in the art. The CMOS pass gate 340 then controls which tracking arrays are enabled if more than one tracking array is provided. The control register 335 may be programmed through a basic input/output system (BIOS) configuration routine stored in the ROM 117 (FIG. 1) or another configuration step.

The second tracking array 330 is configured and operates in the same manner as the first tracking array 300 such that both self-tracking memory arrays together are used to track the memory array 125 and provide the SAE signal 255. Additional arrays may be used to provide minor adjustments in the delay by increasing the bitline capacitance. It will be appreciated by those of skill in the art that additional arrays may be enabled and utilized in a similar manner.

It will also be appreciated by those of skill in the art that although the present invention has been described with reference to memory cells storing a logical "0", the present invention may also be implemented using self-tracking memory cells which are configured to store a logical "1" with the remainder of the self-tracking sense amplifier strobing circuit being adjusted in polarity to operate as described above. Further, it will be appreciated by those of skill in the art that a larger or smaller number of self-tracking memory cells and/or arrays may be used in accordance with the invention.

Also in alternate embodiments, the precharge device may be replaced with multiple precharge devices to form a larger precharge circuit which performs the same function as the precharge device. For example, the single PMOS precharge transistor 315 shown in FIG. 3 may be replaced by three precharge transistors or another configuration which is the same or similar to precharge circuitry in the main memory array 125 (FIG. 1) which is being read.

The self-tracking sense amplifier strobing circuit of the invention provides several advantages over prior approaches. The self-tracking sense amplifier strobing circuit tracks cell current and bitline capacitance experienced by the memory cells in the memory array to be read, such that variations in processing conditions which cause the bit line development rate of the memory array to be slower also affect the self-tracking circuit. In this manner, race conditions between the WLE signal and the SAE signals can be prevented over a wide range of processing and power supply variations.

Further, the self-tracking sense amplifier strobing circuit is simple and thus, robust. Based on the simplicity of the self-tracking circuit, there is less possibility of design or processing errors causing the circuit to fail during manufacturing or use. The self-tracking sense amplifier strobing circuit also strikes a balance between small size such that it takes up very little room on a memory chip, while enough self-tracking memory cells are provided to track the memory array closely enough to provide reliable memory read performance over a wide range of process variations.

Figure 4:
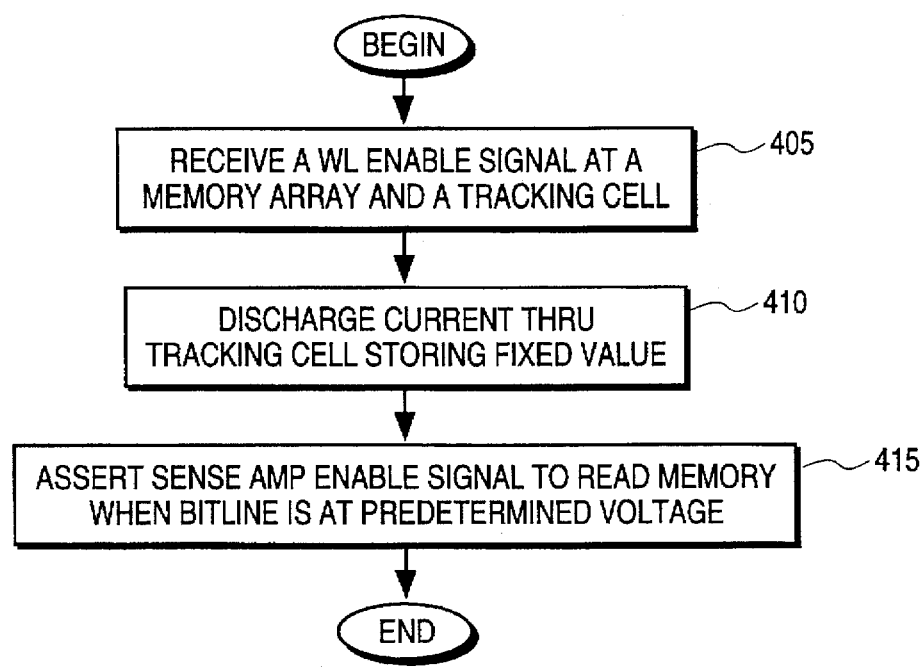
FIG. 4 is a flow diagram illustrating the self-tracking sense amplifier strobing method of one embodiment of the invention.

FIG. 4 illustrates the method of one embodiment of the invention. In step 405, a WLE signal is received at a memory array to be read and at a self-tracking memory cell in a self-tracking array. In accordance with one embodiment, the self-tracking memory cell is configured to store a fixed value. In step 410, the self-tracking memory cell discharges current in response to the WLE signal and in step 415, a sense amp enable signal is asserted to read from the memory array when a bitline coupled to the self-tracking memory cell reaches a predetermined voltage.

Thus, a method and apparatus for self-tracking of a sense amp enable signal during a memory read operation in order to prevent race conditions across a wide variety of processing variations is described. Whereas many alterations and modifications of the invention may occur to one of ordinary skill in the art after having read the foregoing description, it is to be understood that the particular embodiments shown and described by way of illustration are in no way intended to be considered limiting. Therefore, references to details of various embodiments are not intended to limit the scope of the claims which in themselves recite only those features regarded as essential to the invention.

I claim:

1. An apparatus for providing a sense amplifier enable signal in response to an enable signal, the sense amplifier enable signal enabling a memory array to be read, the apparatus comprising:

a first array of tracking memory cells including at least a first tracking cell configured to store a fixed value and coupled to receive the enable signal;

first and second bitlines coupled to the first array, the first bitline to be coupled to a power source; and an output coupled to the second bitline, the output being asserted to provide a sense amplifier enable signal when the second bitline reaches a predetermined voltage in response to the enable signal being received by the cell.

2. The apparatus as set forth in claim 1 wherein the first tracking array includes eight tracking memory cells.

3. The apparatus as set forth in claim 1 further including a precharge circuit coupled to the first and second bitlines and coupled to receive the enable signal, the precharge circuit to precharge the bitlines prior to receiving the enable signal.

4. The apparatus as set forth in claim 3 wherein the precharge circuit includes a single PMOS device.

5. The apparatus as set forth in claim 1 wherein the fixed value is a logical "0".

6. The apparatus as set forth in claim 1 further including:
a CMOS pass gate coupled to the first tracking array,
a second array of tracking memory cells coupled to the pass gate, and
a programmable register to control the pass gate such that the second tracking array can be selectively utilized.

7. The apparatus as set forth in claim 1 wherein the memory array to be read includes a first number of memory cells in a memory column and the first tracking array includes a smaller number of tracking memory cells than the first number and greater than one.

8. A memory for use in a computer system, the memory comprising:

a memory array;

an input to receive a memory read request;

logic to generate a wordline enable signal in response to the memory read request; and a memory read control unit including:

a first array of self-tracking memory cells configured to store a fixed value and including at least a first self-tracking cell coupled to receive the wordline enable signal, first and second bitlines coupled to the first array, the first bitline to be coupled to a power source, and an output coupled to the second bitline, the output being asserted to provide a sense amplifier enable signal to enable reading of the memory array when the second bitline transitions to a predetermined voltage in response to the wordline enable signal being received by the self-tracking cell.

9. The memory as set forth in claim 8 wherein the memory read control unit further includes a precharge circuit coupled to the first and second bitlines to precharge the bitlines prior to receiving the wordline enable signal on the input.

10. The memory as set forth in claim 8 wherein the fixed value is a logical "0".

11. The memory as set forth in claim 8 further including:
a second self-tracking array including at least a second self-tracking cell,
a CMOS pass gate coupled to the second self-tracking array and the first self-tracking array, and
a programmable register to control the pass gate to selectively enable use of the second self-tracking array.

12. A method for providing a sense amplifier enable signal for a memory array to be read, the method comprising the steps of:

receiving a wordline enable signal coupled to the memory array to be read and to at least a first tracking cell in a first self-tracking memory array configured on the memory array, the tracking cell storing fixed value;

discharging current through the tracking cell in response to the wordline signal being enabled; and asserting a sense amplifier enable signal to enable reading of the memory array when a bitline coupled to the tracking cell reaches a predetermined voltage.

13. The method as set forth in claim 12 further including a step of precharging the bitline prior to receiving the wordline enable signal.

14. The method as set forth in claim 12 wherein the fixed value is a logical "0".

15. The method as set forth in claim 12 further including a step of enabling a second self-tracking array.

* * * * *